United States Patent [19]
Wissman

[11] Patent Number: 5,703,481
[45] Date of Patent: Dec. 30, 1997

[54] APPARATUS FOR DETECTING DIGITAL CARRIER SIGNALS ON TELEPHONE CABLES

[75] Inventor: Charles H. Wissman, Oceanside, Calif.

[73] Assignee: Tempo Research Corporation, Vista, Calif.

[21] Appl. No.: 646,929

[22] Filed: May 8, 1996

Related U.S. Application Data

[62] Division of Ser. No. 206,441, Mar. 4, 1994, Pat. No. 5,522,702.

[51] Int. Cl.$^6$ .................................................. G01R 19/16
[52] U.S. Cl. ........................................ 324/127; 324/126
[58] Field of Search ............................... 324/117 R, 220, 324/219, 251, 127, 126, 133; 455/41, 164.1; 375/75, 36; 340/664, 654, 634; 336/176; 379/49, 443

[56] References Cited

U.S. PATENT DOCUMENTS

| | | | |
|---|---|---|---|
| 3,197,702 | 7/1965 | Schweitzer, Jr. | 324/127 |
| 3,840,802 | 10/1974 | Anthony | 324/219 |
| 4,085,298 | 4/1978 | Seidel | 324/126 |
| 4,331,915 | 5/1982 | Fielden | 324/127 |
| 4,454,557 | 6/1984 | Hurley | 324/127 |
| 4,491,790 | 1/1985 | Miller | 324/127 |
| 4,706,017 | 11/1987 | Wilson | 324/127 |
| 5,140,614 | 8/1992 | Buzbee et al. | 455/164.1 |
| 5,552,702 | 9/1996 | Wissman | 324/127 |

*Primary Examiner*—Vinh P. Nguyen
*Attorney, Agent, or Firm*—Amster, Rothstein & Ebenstein

[57] ABSTRACT

A sensor for permitting a signal carried on a tested conductor to be either inductive or capacitively coupled, in non intrusive manner, onto first or second output conductors includes a partially hollow material with high magnetic permeability wound by a first output conductor for permitting a signal carried on a tested conductor to be inductively coupled onto the first output conductor and a conductive material inserted partially within the hollow material and connected to the second output conductor for permitting a signal carried on a tested conductor to be capacitively coupled onto the second output conductor.

4 Claims, 2 Drawing Sheets

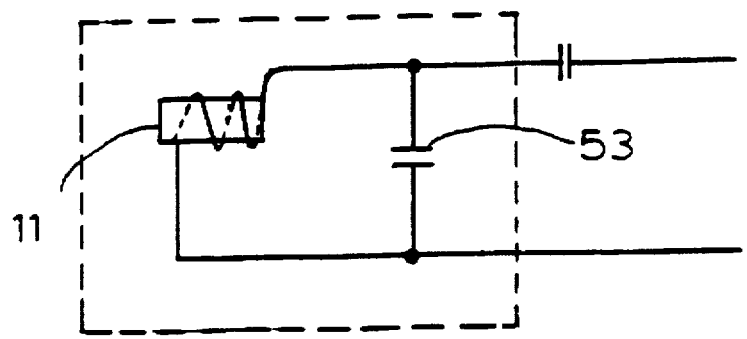
F I G. 1A
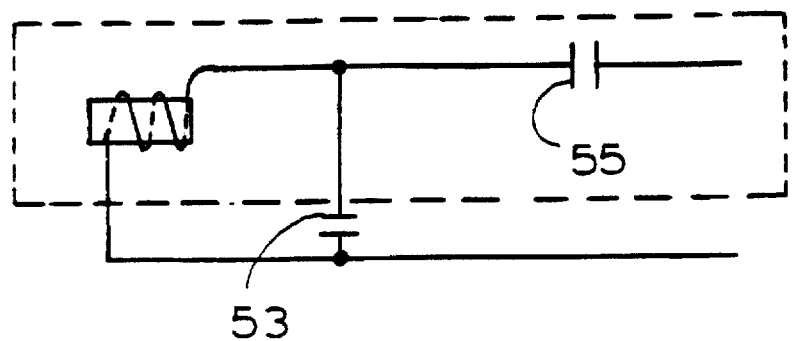
F I G. 1B
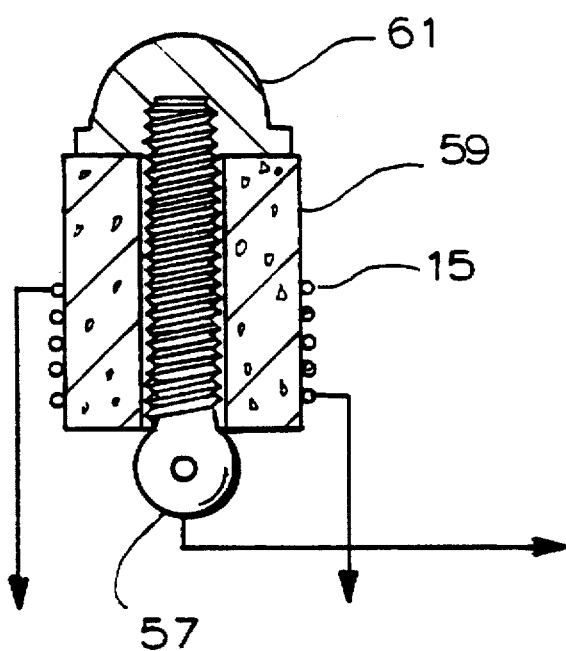
F I G. 2

APPARATUS FOR DETECTING DIGITAL CARRIER SIGNALS ON TELEPHONE CABLES

This is a divisional of application Ser. No. 08/206,441 filed on Mar. 4, 1994, now U.S. Pat. No. 5,552,702.

BACKGROUND

The present invention relates to an improved method and apparatus for non-intrusive detection of electronic signals in conductors; specifically to an improved method and apparatus for detecting the presence, identity, and relative strength of digital carrier signals on telephone cables.

A popular technique for increasing the efficiency of telephone signal transmission over a twisted pair transmission line is the use of digital carriers in a multiplexing scheme. The ability to determine which twisted pairs in the telephone cable bundle are carrying digital carrier signals is essential when repairing or modifying such cables. One must be able to make such determination in a non-intrusive manner or telephone service will be interrupted.

Prior art non-intrusive digital carrier signal detection schemes exist but require expensive heterodyning signal processing circuitry or fail to provide any information about the relative strength or identity of the digital carrier. An example of the prior art heterodyning signal processing circuitry is disclosed in Buzbee, U.S. Pat. No. 5,140,614, which requires crystal controlled oscillators and mixing amplifiers which are complex and costly relative to the apparatus of the present invention.

In addition, the Buzbee U.S. Pat. No. 5,140,614 refers, in the background section, to a carrier signal detection apparatus which does not require heterodyning signal processing circuitry, but which fails to provide relative signal strength or signal identity information. The signal on the twisted pair transmission line is obtained by capacitive or inductive coupling and is filtered so as to pass only the carrier signal. This signal is then amplified and if the signal exceeds a threshold level an audio tone is generated. The only information conveyed by the scheme is that the carrier signal has exceeded the threshold level. The relative strength of the signal and the carrier identity are undetectable and remain unknown.

Furthermore, the prior art detection schemes disclosed in Buzbee U.S. Pat. No. 5,140,614 do not disclose conductive signal probes which can detect both digital carrier signals and audible frequency tracing tones, thereby not allowing a particular wire to be traced from one location to another with the same sensing probe that detects whether or not a carrier signal is present.

Accordingly, it is an object of the present invention to provide a cost effective apparatus and method for detecting the presence, the relative strength, and the identity of digital carrier signals on a telephone cable.

It is another object of the invention to provide an apparatus and method for detecting digital carriers on a telephone cable in a non-intrusive manner so as not to degrade or interrupt telephone service being carried on the telephone cable.

Still another object of the present invention is to provide a method and apparatus for detecting both digital carrier signals and audio frequency tracing tones with the same non-invasive probe.

SUMMARY OF THE INVENTION

Further objects and advantages will become apparent from a consideration of the ensuing description and drawings. However, in general, the apparatus of the present invention detects digital carrier signals on conductors. The apparatus comprises a sensor probe, a filter, a signal processing circuit, a signal identification circuit, a signal strength indicator circuit and an output means. The sensor collects a portion of the signal from a pair of conductors and couples this portion of the signal from the conductors to the apparatus in a non-intrusive manner. The filter is used to enhance the sensitivity of the sensor probe by filtering out undesirable frequency components from the carrier signal while passing chosen carrier frequencies. After filtering, the signal is amplified and passed to the identification circuit which receives the signal, determines whether the signal is of high or low frequency and outputs this information to the user by lighting either an LED indicating the presence of a high frequency signal, or an LED indicating the presence of a low frequency signal. Simultaneously with passing the signal to the identification means, the signal is also passed through the signal strength indicator circuit to an output means. The output means outputs an audible tone whose strength is proportional to the strength of the carrier signal. This tone advantageously indicates both the presence and relative strength of the carrier signal.

In a specific preferred embodiment, the sensor comprises an inductive probe for detecting the carrier signal on a twisted pair of transmission lines. The inductive probe is advantageously configured so as to be conductive as well as inductive thereby also allowing for detection of an audio frequency tracing tone present on the twisted pair transmission line. This improved sensing probe reduces the amount of cumbersome equipment required to monitor a line, thus allowing a repair person to carry fewer pieces of equipment and further increasing the cost effectiveness of the apparatus.

The apparatus of the present invention provides a cost effective means for probing a pair of wires in a telephone cable. A telephone repair person may use this invention to determine which wire pairs are in service by examining which wire pairs are conducting digital carrier signals. Because the volume of the audible tone is proportional to the strength of the carrier signal, the volume of the audible tone can be used to determine if the pair being probed is actually in service or merely carrying a cross talk coupled signal (noise). Additionally, a specific embodiment which detects audible tracing tones may be used to trace a single transmission line pair in a bundle of pairs. Thus, the present invention allows a user with a single probe to detect which line pairs are active (conducting carrier signals); and to trace an individual line pair from one location to another (audio tracing signals).

BRIEF DESCRIPTION OF THE DRAWINGS

The above and related objects, features and advantages of the present invention will be more fully understood by reference to the following detailed description of the presently preferred embodiments of the invention, when taken in conjunction with the accompanying drawings wherein:

FIG. 1A is a parallel resonant circuit of a filter means of the apparatus of FIG. 1.

FIG. 1B is a series resonant circuit of a filter means of the apparatus of FIG. 1.

FIG. 2 is a sectional schematic representation showing details of a presently preferred embodiment of a sensing probe of FIG. 1.

DESCRIPTION OF THE PREFERRED EMBODIMENT

Figure 1:
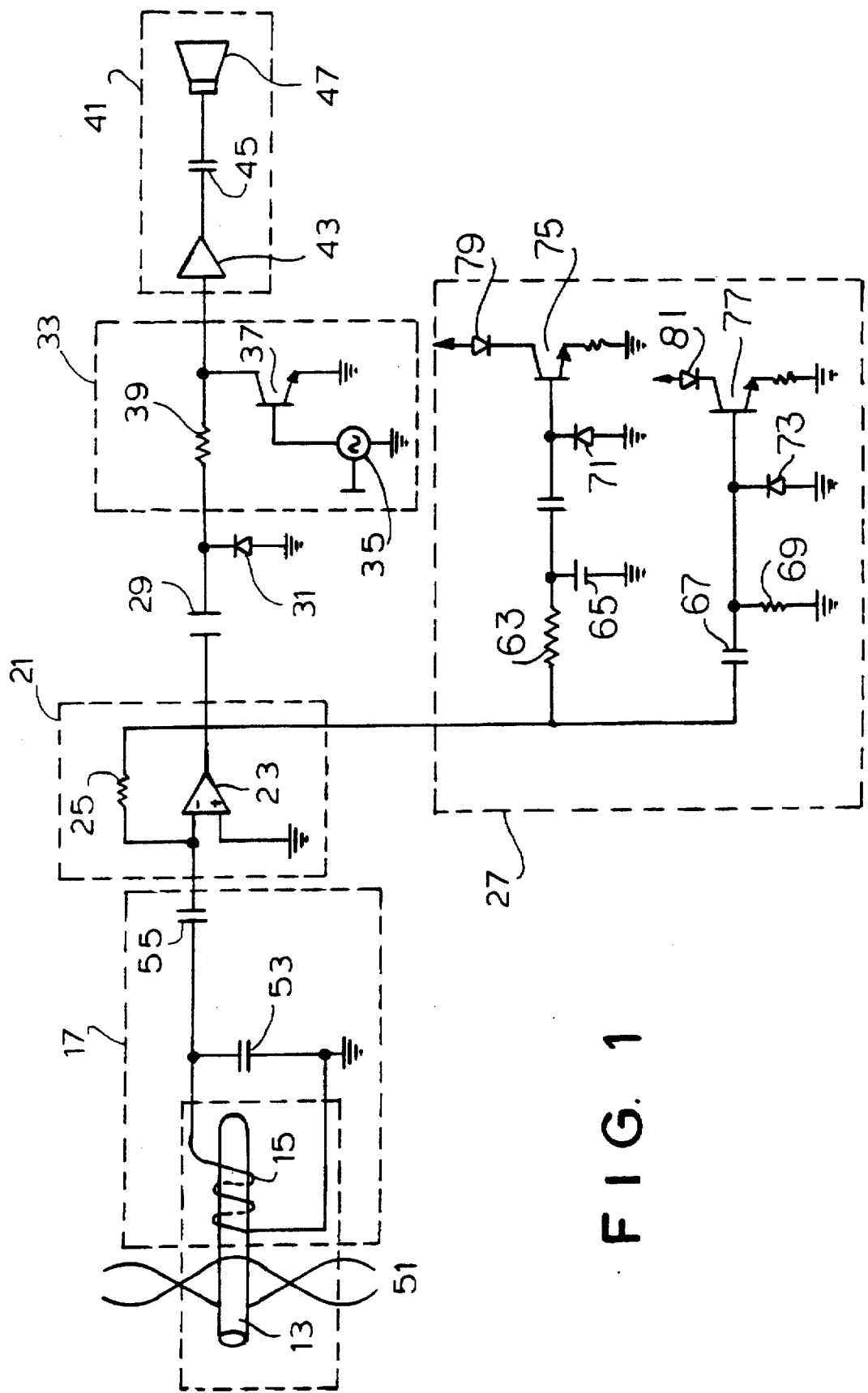
FIG. 1 is a circuit diagram of the apparatus of the present invention, in accordance with a preferred embodiment.

FIG. 1 shows a circuit diagram of the present invention, in accordance with a presently preferred embodiment. A sensing probe 11 comprises a high magnetic permeability ferrite core 13 and a wire coil 15 wrapped around ferrite core 13. Filter means 17 is coupled to sensor probe 11 and comprises a parallel resonant circuit (See FIG. 1A) and a series resonant circuit (See FIG. 1B), both of which are described in greater detain hereinafter. A transimpedance amplifier 21 is connected to filter means 17 and comprises an operational amplifier 23 and a resistor 25 connected in a transimpedance amplifier configuration with amplifier 23. Signal processing means comprising capacitor 29 and diode 31, is coupled to the output of transimpedance amplifier 21. Signal identification means 27 is also operatively coupled to transimpedance amplifier 21. Signal strength identification means 33 is further coupled to the output of transimpedance amplifier 21 and comprises an audio oscillator 35, a transistor 37 and a resistor 39. Output means 41 comprising an audio amplifier 43, a blocking capacitor 45 and a speaker 47, operatively connects to signal strength identification means 33.

As shown, sensing probe 11 is an inductive sensor formed by wrapping multiple turns of wire around the high magnetic permeability ferrite core 13. In operation, when sensing probe 11 is placed between a pair of wires forming a twisted pair of transmission lines 51, a current is produced in coil 15 due to the magnetic field associated with lines 51. The current generated in coil 15 is directly proportional to, or a sample of, the current in lines 51. A capacitive probe may also be used to sample the signal carried by lines 51. However, the magnetic field of the transmission lines signal is more tightly confined between the wires of lines 51 than is the electric field thereby making an inductive probe less susceptible to pick up stray signals from adjacent lines. Further, the more tightly confined magnetic field allows an inductive probe to output a stronger signal in response to detection of a given carrier signal than would a capacitive probe in response to the same signal.

Referring to FIG. 1A, the output of the sensing probe 11 is connected in parallel with a capacitor 53, forming a parallel resonant circuit. The two most common frequencies carried by a twisted pair of transmission lines are 772 KHz and 28 KHz. The frequency of resonance of the parallel resonant circuit is chosen to be equal to one of these two digital carrier frequencies (i.e. 772 KHz). Referring to FIG. 1B, the output of sensing probe 11 is also connected in series with capacitor 55, forming a series resonant circuit. The frequency of resonance of the series resonant circuit in FIG. 1B is chosen to be equal to the other most common digital carrier frequency (i.e. 28 KHz). The resonant circuits of FIGS. 1A and 1B enhance the sensitivity of sensor probe 11 and reject unwanted frequencies. The output of this resonant network formed by sensor probe 11, capacitor 53, and capacitor 55 is connected as shown in FIG. 1 to the input of an operational amplifier 23. Operational amplifier 23 is in a transimpedance configuration. By grounding the positive input and connecting resistor 25 between the output and negative input of operational amplifier 23, the transimpedance amplifier 21 produces an output voltage which is proportional to the input current from filter means 17. DC blocking capacitor 29 connected between diode 31 and transimpedance amplifier 21 isolates amplifier 23 from any subsequent DC voltage.

Diode 31 receives the carrier signal from transimpedance amplifier 21 and rectifies the carrier signal thereby creating a DC voltage that is proportional to the AC output of transimpedance amplifier 21. Thus, the rectified carrier signal is proportional to the actual carrier signal level. An AC voltage at the carrier frequency is still present and may be filtered out with a low pass filter (not shown). This is generally not required as carrier frequencies are too high for detection by either audio amplifier 43 or the human ear. Upon rectification, the DC voltage, which is proportional to the carrier signal level is input to a chopper modulator 33 comprising resistor 39, audio oscillator 35, and transistor 37. Chopper modulator 33 creates an audio frequency (typically 1 to 2 KHz) whose amplitude is proportional to the input DC voltage level and therefore is also proportional to the strength of the carrier signal itself. As the carrier signal strength increases, the audio frequency becomes louder, thus giving an audio indication of carrier signal strength. The signal is then passed to audio amplifier 43 which provides additional gain and a lower output impedance to drive a speaker 47. A DC blocking capacitor 45 connected between speaker 47 and audio amplifier 43 isolates speaker 47 from any DC voltages between audio amplifier 43 and speaker 47.

FIG. 2 is a schematic diagram showing in detail a preferred embodiment of sensing probe 11 of FIG. 1, wherein sensing probe 11 comprises a conductive threaded metal rod 57, a hollow ferrite core 59 surrounding threaded rod 57 and a metal cap nut 61 which is screwed onto threaded rod 57. Threaded rod 57 is placed inside hollow ferrite core 59 and metal cap nut 61 is screwed onto threaded rod 57 to hold it within hollow ferrite core 59. A wire is wrapped around hollow ferrite core 59 to create coil 15. Metal cap nut 61 and threaded metal rod 57 act as a conductive audio probe, thus allowing for the detection of audio tracing tones and digital carrier signals with the same probe.

An audio tracing tone is used to trace a single transmission line pair in a bundle of pairs. A distinctive large amplitude tracing tone (nominally at 577 Hz) is transmitted from the end of the pair of interest. By bringing conductive sensing probe 11 in close proximity to the pair of interest, a portion of the tracing tone will be capacitively coupled to sensing probe 11. The coupled portion can be amplified and then used to drive a speaker, thus indicating that the probe is near the pair of interest (The method of amplifying and driving the speaker is well known). Threaded metal rod 57 and metal cap nut 61 capacitively couple a portion of the audio tracing tone to sensing probe 11. Hollow ferrite core 59 and wire coil 15 may still be used for sampling digital carrier signals as described above; thus, this single probe may detect either audio tracing tones or digital carrier signals.

Referring again to FIG. 1, optional signal identification means 27 is shown coupled between amplifier 23 and capacitor 29 of the present invention. Because the same audio indication will occur independent of which carrier frequency is present, this additional circuitry is provided for carrier identification. Signal identification means 27 comprises a low pass filter comprising a resistor 63 and a capacitor 65; and a high pass filter comprising a capacitor 67 and a resistor 69. Signal identification means 27 further comprises a first rectifying diode 71, a second rectifying diode 73, a first transistor 75, a second transistor 77 and light emitting diodes (LED's) 79 and 81. In operation, the low pass filter will pass the lower of the two carrier frequencies and reject the higher frequency signal. If the lower frequency carrier signal is present, it will be rectified by diode 71 and subsequently will turn on transistor 75. When transistor 75 is turned on, LED 79 will light indicating that the lower frequency carrier signal is present. Similarly, if the higher frequency carrier signal is present, it will be rectified by diode 73 and cause transistor 77 to turn on. LED 81 will then light, indicating the presence of the higher frequency carrier signal. In this manner, the carrier signal frequency can be determined by viewing which LED is lit. If LED 79 is lit, the lower frequency carrier signal is present. If LED 81 is lit, the higher frequency carrier signal is present.

In summary, the present invention relates to an improved method and apparatus for non-intrusive detection of electronic signals on conductors; specifically to an improved method for detecting the presence, identity, and relative strength of digital carrier signals on telephone cables. The present invention can be realized with inexpensive operational amplifiers and transistors, unlike prior art requiring costly heterodyning circuitry. Additionally, the present invention allows for the simultaneous detection of both digital carrier signals and audio tracing tones, further increasing its cost effectiveness by eliminating the need for a separate probe for sensing each type of signal. Thus, the present invention allows a technician to determine the presence, identity and relative strength of a digital carrier signal by producing an audio tone with a volume indicative of the carrier signal strength and by illuminating an LED which indicates the carrier signal's identity. The relative strength of the carrier signal allows the technician to determine if the pair being probed is actually in service or merely carrying a cross talk coupled signal. Further, the present invention also provides an improved sensing probe which allows a technician to detect both digital carrier signals, and audio tracing tones with a single probe.

Now that the preferred embodiments of the present invention have been shown and described in detail, various modifications and improvements thereon will become readily apparent to those skilled in the art. For instance, although the apparatus of the present invention has been described as producing an audio indication of signal strength, and a visual indication of signal identity, alternative indicators may be used. Accordingly, the spirit and scope of the present invention is to be construed broadly and limited only by the appended claims, and not by the foregoing specification.

What is claimed is:

1. A sensor for permitting a signal carried on a tested conductor to be either inductively or capacitively coupled, in non-intrusive manner, onto first or second output conductors, said sensor comprising:

an at least partially hollow material having high magnetic permeability wound by a first output conductor, said partially hollow material permitting a signal carried on a tested conductor to be inductively coupled onto said first output conductor; and a conductive material inserted at least partially within said partially hollow material and connected to a second output conductor, said conductive material permitting a signal carried on a tested conductor to be capacitively coupled onto said second output conductor.

2. The sensor of claim 1 wherein said partially hollow material is a ferrite material.

3. The sensor of claim 1 wherein said partially hollow material and said conductive material permit digital carrier signals and audio tracing tones to be monitored simultaneously on said first and said second output conductors, respectively.

4. The sensor of claim 1 wherein said partially hollow material and said conductive material permit signals associated with magnetic and electric fields to be monitored simultaneously on said first and second output conductors, respectively.

* * * * *